(12) United States Patent
Singh et al.

(10) Patent No.: US 9,305,810 B2
(45) Date of Patent: Apr. 5, 2016

(54) METHOD AND APPARATUS FOR FAST GAS EXCHANGE, FAST GAS SWITCHING, AND PROGRAMMABLE GAS DELIVERY

(75) Inventors: Saravjeet Singh, Santa Clara, CA (US); Roy C. Nangoy, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 899 days.

(21) Appl. No.: 13/456,006

(22) Filed: Apr. 25, 2012

(65) Prior Publication Data

US 2013/0000731 A1 Jan. 3, 2013

Related U.S. Application Data

(60) Provisional application No. 61/503,346, filed on Jun. 30, 2011.

(51) Int. Cl.
*F17D 1/00* (2006.01)
*H01L 21/67* (2006.01)

(52) U.S. Cl.
CPC ...... *H01L 21/67017* (2013.01); *H01L 21/6719* (2013.01); *Y10T 137/0318* (2015.04); *Y10T 137/87096* (2015.04)

(58) Field of Classification Search
CPC ... F16K 19/00; F16K 27/003; H01L 21/6719; H01L 21/67017; Y10T 137/2499; Y10T 137/87249; Y10T 137/87877; Y10T 137/0318; Y10T 137/87096
USPC ............................................. 137/88, 597, 606
See application file for complete search history.

(56) References Cited

U.S. PATENT DOCUMENTS

| | | | | |
|---|---|---|---|---|
| 4,816,050 | A | * | 3/1989 | Roba ................................ 65/382 |
| 5,453,124 | A | * | 9/1995 | Moslehi et al. ................ 118/715 |
| 5,496,408 | A | * | 3/1996 | Motoda et al. ................. 118/715 |
| 5,501,893 | A | | 3/1996 | Laermer et al. |
| 5,616,208 | A | * | 4/1997 | Lee ................................ 118/715 |

(Continued)

FOREIGN PATENT DOCUMENTS

KR 10-0655445 12/2006

OTHER PUBLICATIONS

International Search Report and Written Opinion of the International Searching Authority mailed Nov. 29, 2012 in PCT/US2012/034905.

(Continued)

*Primary Examiner* — Craig J Price
(74) *Attorney, Agent, or Firm* — Patterson & Sheridan, LLP (57) ABSTRACT

Embodiments of the invention relate to a gas delivery system. The gas delivery system includes a fast gas exchange module in fluid communication with one or more gas panels and a process chamber. The fast gas exchange module has first and second sets of flow controllers and each of first and second sets of flow controllers has multiple flow controllers. The flow controller is configured such that each of the flow controllers in the first and second sets of the flow controllers is independently operated to selectively open to divert gas to the process chamber or an exhaust. The first and second sets of flow controllers are operated for synchronized switching of gases in a pre-determined timed sequence of flow controller actuation. The invention enables fast switch of resultant gas flow in the process chamber while having individual flow controller operated at lower switching speed to provide longer service life.

19 Claims, 4 Drawing Sheets

(56) References Cited

U.S. PATENT DOCUMENTS

| | | | |
|---|---|---|---|
| 5,647,945 A * | 7/1997 | Matsuse et al. | 156/345.38 |
| 5,683,517 A * | 11/1997 | Shan | 118/723 E |
| 5,826,607 A * | 10/1998 | Knutson et al. | 137/597 |
| 5,865,205 A | 2/1999 | Wilmer | |
| 6,133,148 A | 10/2000 | Won et al. | |
| 6,162,323 A * | 12/2000 | Koshimizu | 118/723 L |
| 6,245,192 B1 | 6/2001 | Dhindsa et al. | |
| 6,360,762 B2 * | 3/2002 | Kitayama et al. | 137/1 |
| 6,409,933 B1 | 6/2002 | Holland et al. | |
| 6,414,648 B1 | 7/2002 | Holland et al. | |
| 6,418,954 B1 | 7/2002 | Taylor et al. | |
| 6,439,253 B1 * | 8/2002 | Easton | 137/88 |
| 6,462,481 B1 | 10/2002 | Holland et al. | |
| 6,507,155 B1 | 1/2003 | Barnes et al. | |
| 6,579,372 B2 * | 6/2003 | Park | 118/715 |
| 6,593,244 B1 | 7/2003 | Wang et al. | |
| 6,685,798 B1 | 2/2004 | Holland et al. | |
| 6,694,915 B1 | 2/2004 | Holland et al. | |
| 6,752,166 B2 | 6/2004 | Lull et al. | |
| 6,772,781 B2 | 8/2004 | Doty et al. | |
| 6,799,603 B1 * | 10/2004 | Moore | 137/597 |
| 6,800,139 B1 | 10/2004 | Shinriki et al. | |
| 6,846,746 B2 | 1/2005 | Rattner et al. | |
| 6,849,554 B2 | 2/2005 | Rattner et al. | |
| 6,900,133 B2 | 5/2005 | Chinn et al. | |
| 7,074,723 B2 | 7/2006 | Chinn et al. | |
| 7,174,263 B2 | 2/2007 | Shajii et al. | |
| 7,666,479 B2 * | 2/2010 | Strang | 427/569 |
| 7,708,859 B2 | 5/2010 | Huang et al. | |
| 7,828,016 B2 * | 11/2010 | Otsuki et al. | 137/884 |
| 7,829,144 B2 * | 11/2010 | Matsuse et al. | 427/248.1 |
| 7,846,497 B2 * | 12/2010 | Gold et al. | 427/248.1 |
| 8,087,427 B2 * | 1/2012 | Suzuki et al. | 118/715 |
| 8,235,001 B2 * | 8/2012 | Sano et al. | 118/715 |
| 8,397,668 B2 * | 3/2013 | Kobayashi et al. | 118/715 |
| 8,539,908 B2 * | 9/2013 | Takagi | 118/715 |
| 8,636,871 B2 * | 1/2014 | Sawada et al. | 156/345.47 |
| 8,770,214 B2 * | 7/2014 | Uchida et al. | 118/715 |
| 8,826,935 B2 * | 9/2014 | Nakada et al. | 137/487.5 |
| 8,895,457 B2 * | 11/2014 | Akae et al. | 118/715 |
| 8,931,512 B2 * | 1/2015 | Cruse et al. | 137/88 |
| 2001/0011526 A1 | 8/2001 | Doering et al. | |
| 2001/0047756 A1 | 12/2001 | Bartholomew et al. | |
| 2002/0192369 A1 | 12/2002 | Morimoto et al. | |
| 2003/0070620 A1 | 4/2003 | Cooperberg et al. | |
| 2003/0207579 A1 | 11/2003 | Rattner et al. | |
| 2004/0007178 A1 | 1/2004 | Forrest et al. | |
| 2004/0045669 A1 | 3/2004 | Okumura et al. | |
| 2004/0050326 A1 | 3/2004 | Thilderkvist et al. | |
| 2004/0097077 A1 | 5/2004 | Nallan et al. | |
| 2004/0112538 A1 | 6/2004 | Larson et al. | |
| 2004/0118342 A1 | 6/2004 | Cheng et al. | |
| 2004/0157457 A1 | 8/2004 | Xu et al. | |
| 2005/0098105 A1 | 5/2005 | Fuss et al. | |
| 2005/0103749 A1 | 5/2005 | Puech et al. | |
| 2005/0241763 A1 | 11/2005 | Huang et al. | |
| 2006/0011237 A1 | 1/2006 | Tison et al. | |
| 2006/0118518 A1 | 6/2006 | Rusu et al. | |
| 2006/0137710 A1 | 6/2006 | Lim et al. | |
| 2007/0240778 A1 * | 10/2007 | L'Bassi et al. | 137/883 |
| 2009/0272717 A1 | 11/2009 | Pamarthy et al. | |
| 2010/0055400 A1 | 3/2010 | Farr et al. | |
| 2010/0197138 A1 | 8/2010 | Cheshire et al. | |
| 2010/0308014 A1 | 12/2010 | Cheshire | |

OTHER PUBLICATIONS

PCT International Search Report and Written Opinion dated Sep. 24, 2009, for International Application No. PCT/US2009/037647.
Prosecution History of U.S. Appl. No. 12/407,548.

\* cited by examiner

FIG. 5 ved substrate processing system. Specifically, embodiments of the invention relate to a fast gas exchange system that is suitable for etching and/or deposition process.

METHOD AND APPARATUS FOR FAST GAS EXCHANGE, FAST GAS SWITCHING, AND PROGRAMMABLE GAS DELIVERY

CROSS-REFERENCE TO RELATED APPLICATIONS

This application claims benefit of U.S. provisional patent application Ser. No. 61/503,346, filed Jun. 30, 2011, which is herein incorporated by reference.

BACKGROUND

1. Field

Embodiments of the invention generally relate to an improved substrate processing system. Specifically, embodiments of the invention relate to a fast gas exchange system that is suitable for etching and/or deposition process.

2. Description of the Related Art

The fabrication of microelectronic devices includes a number of different stages, each including a variety of processes. During one stage, a particular process may include imparting a plasma to the surface of a substrate, such as a silicon substrate, to alter the physical and material properties of the substrate. This process may be known as etching, which may involve the removal of materials to form holes, vias, and/or other openings (referred to herein as "trenches") in the substrate.

Plasma etch reactors are commonly used for etching trenches in semiconductor substrates. These reactors contain a chamber within which the substrate is supported. At least one reactive gas is supplied to the chamber and a radio frequency signal is coupled to the reactive gas to form the plasma. The plasma etches the substrate that is positioned within the reactor. The substrate may also be coupled to a radio frequency signal to bias the substrate during the etching process to enhance etching performance and trench profile.

Through silicon via ("TSV") etching is a unique application that requires a low frequency bias and a low temperature environment to form deep trenches in a silicon substrate. One type of etching system may include in situ plasma etching. Using this type of etching system, a trench can be formed by alternating the removal and deposition of material on a substrate in a single reactor with a removing plasma and a deposition plasma. Another type of etching system may include remote plasma etching. Using this type of etching system, a trench can be formed as in the in situ system, except that the plasmas may be generated in a remote reactor prior to being introduced onto the substrate located in the primary reactor. In addition to the types of etching systems, the process of etching with each system may also vary. Some etching processes employ multi-step approaches, such as a time multiplexed gas modulation ("TMGM") system or a Bosch system, that includes several recipe steps, such as etch and deposition step, or etch, flash, and deposition steps. The TMGM process etches a material for a period of time and then deposits a protective film upon the previously etched surface to protect the surface, typically the sidewalls of the trench, from further etching. These two steps are repeated as a deeper and deeper trench is formed. As the process development continues for smaller and deeper TSV geometry, the recipe may require fast switching between etching gas, deposition gas, passivation gas or cleaning gas. Therefore, the switching gases become more critical in controlling the etch profile, sidewall protection, selectivity, and etch rate (i.e., throughput).

For faster etch rates and smooth etch profile, faster switching of gases is needed. Faster switching means more duty cycles per unit time period. In conventional gas delivery systems, the speed of gas introduction to the processing chamber is limited by the valve switching speed due to the mechanical nature of the system. Additionally, a process recipe that requires gas switching at, for example, 0.2 second intervals, the gas switching valve will be cycled more than 78 million times annually. As the service life for a typical valve is about 3 million cycles, the need for expensive, high performance valves with extended service life or frequent valve replacement is required, which undesirably increases the chamber downtime for service and the cost of ownership.

Therefore, there is a need for an improved method and apparatus for etching.

SUMMARY

Embodiments of the invention generally relates to an improved substrate etching system and methods for etching. In one embodiment, a method of supplying gases to a process chamber is provided. The method includes supplying a first process gas to the process chamber from a first gas panel through a first fast gas exchange module during a first process, comprising selectively diverting the first process gas from a first flow controller through a second flow controller to the process chamber or an exhaust, or selectively diverting the first process gas from the first flow controller through a third flow controller to the process chamber or the exhaust, wherein the second flow controller is not in fluid communication with the third flow controller, and supplying a second process gas to the process chamber from a second gas panel through a second fast gas exchange module during a second process, comprising selectively diverting the second process gas from a fourth flow controller through a fifth flow controller to the process chamber or an exhaust, or selectively diverting the second process gas from the fourth flow controller through a third flow controller to the process chamber or the exhaust, wherein the fifth flow controller is not in fluid communication with the sixth flow controller, wherein the first and second process gases are supplied into the process chamber in an alternating sequence.

In another embodiment, a method of supplying gases to a process chamber is provided. The method includes supplying a first process gas to the process chamber from a first gas panel through a first fast gas exchange module during a first process, wherein the first fast gas exchange module comprising a first flow controller coupling to the first gas panel, a second flow controller coupling to the first flow controller and the process chamber, and a third flow controller coupling to the first flow controller and the process chamber, wherein the first flow controller is operable to selectively divert the first process gas flowing from the first gas panel to the second flow controller or the third flow controller, the second flow controller is operable to selectively divert the first process gas flowing from the first flow controller to the processing chamber or a exhaust, and the third flow controller is operable to selectively divert the first process gas flowing from the first flow controller to the processing chamber or the exhaust, and supplying a second process gas to the processing chamber from a second gas panel through a second fast gas exchange module during a second process, wherein the second fast gas exchange module comprising a fourth flow controller coupling to the second gas panel, a fifth flow controller coupling to the fourth flow controller and the process chamber, and a sixth flow controller coupling to the fourth flow controller and the process chamber, wherein the fourth flow controller is operable to selectively divert the second process gas flowing from the second gas panel to the fifth flow controller or the sixth flow controller, the fifth flow controller is operable to selectively divert the second process gas flowing from the fourth flow controller to the process chamber or the exhaust, and the sixth flow controller is operable to selectively divert the second process gas flowing from the fourth flow controller to the process chamber or the exhaust. In one example, the method further includes synchronizing a change in a diverting state of each of the flow controllers in the first and second fast gas exchange modules such that a frequency of the first or second process gas flowing into the process chamber is twice a frequency of the change in the diverting state for each of the flow controllers in the first and second fast gas exchange modules.

In yet another embodiment, a gas delivery system is provided. The system includes a process chamber for processing a substrate, and a fast gas exchange module in fluid communication with a first gas panel and the process chamber, wherein the fast gas exchange module having a first flow controller configuration comprises a first flow controller coupled to the first gas panel, a second flow controller coupling the first flow controller and the process chamber, and a third flow controller coupling the first flow controller and the process chamber, wherein the second flow controller is not in fluid communication with the third flow controller, wherein the first flow controller is operable to selectively divert a first gas flowing from the first gas panel to the second flow controller or the third flow controller, the second flow controller is operable to selectively divert the first gas flowing from the first flow controller to the process chamber or a exhaust, and the third flow controller is operable to selectively divert the first gas flowing from the first flow controller to the process chamber or the exhaust. In one example, the fifth and sixth flow controllers are simultaneously operated in a diverting state opposite to each other

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

As set forth herein, embodiments of the invention will be described as they relates to a silicon etching system and process. It is to be noted, however, that embodiments of the invention are not limited to use with silicon etching, but are applicable to etching other types of materials. In various embodiments of the present invention, a gas delivery system is provided. The gas delivery system generally includes a fast gas exchange module in fluid communication with one or more gas panels and a process chamber, wherein the fast gas exchange module has first and second sets of flow controllers and each of the first and second sets of flow controllers has multiple flow controllers, for example, three flow controllers. The flow controller may be a three-way valve or the like so that each of the flow controllers in the first and second sets of the flow controllers is independently operated to selectively open to divert gas(es) to the process chamber or an exhaust. The first and second sets of the flow controllers are operated for synchronized switching of gas(es) in a pre-determined timed sequence of flow controller actuation (i.e., valve timing control) so that resultant gas flow into the process chamber switches faster in the process chamber while having individual flow controller continued to operate at a lower switching speed and therefore longer service life.

The method and apparatus as will be described below may be used for etching a profile, such as a deep trench, in a silicon substrate having oxide and metal layers disposed on the substrate, wherein the etching cycle may include a plurality of plasma processes that are performed in situ within a single, fully automated, reactor. Each such etching cycle may include a deposition step, a first etch step, and a second etch step, and the etching cycle may switch between the deposition and/or etching steps. Each of the steps may be an individual plasma process that is defined by a composition of a gaseous mixture supplied into the process chamber of the reactor where the substrate is supported. Different compositions of gaseous mixtures may be supplied to the chamber during each individual step, depending upon application.

Figure 1:
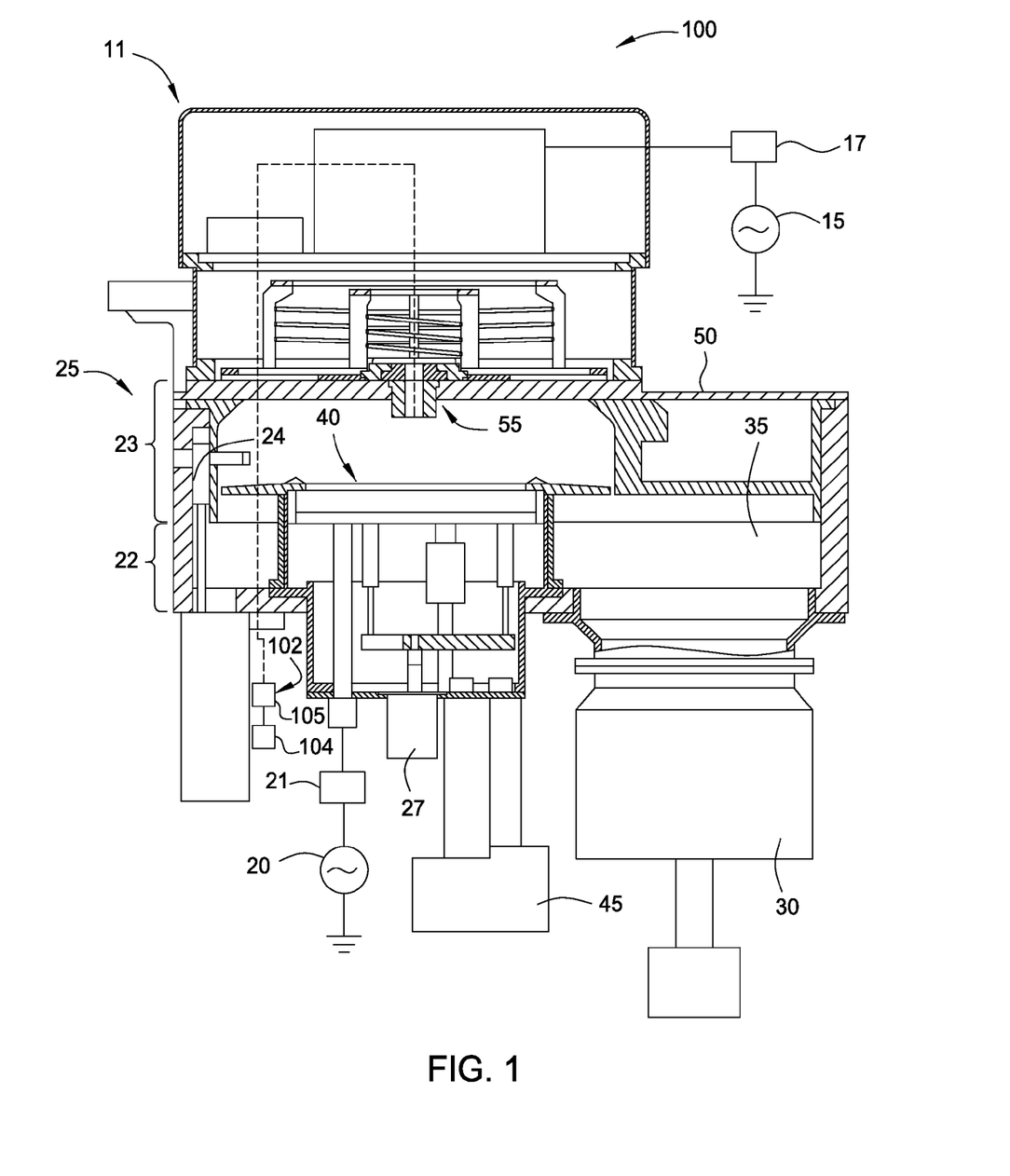
FIG. 1 illustrates a schematic diagram of an exemplary substrate etching system in which a fast gas exchange module according to embodiments of the invention may be implemented.

FIG. 1 illustrates a sectional view of a system, such as a reactor 100, for processing a variety of substrates and accommodating a variety of substrate sizes. The reactor 100 may include the source power 15 and a matching network 17, the bias power 20 and a matching network 21, a process chamber 25, a pump 30, a valve 35, a ceramic electrostatic chuck 40, a chiller 45, a lid 50, a gas nozzle 55, and a gas delivery system 102. The gas delivery system 102 is located in a housing 105 disposed directly adjacent, such as under, the process chamber 25. The gas delivery system 102 may be used to supply at least two different gas mixtures to the process chamber 25. As will be discussed further in FIGS. 2 and 3, the gas delivery system 102 may selectively couple one or more gas sources located in one or more gas panels 104 to the gas nozzle 55 to provide process gases to the process chamber 25 through one or more outlets of the gas nozzles 55. The housing 105 is located in close proximity to the process chamber 25 to reduce gas transition time when changing gases, minimize gas usage, and minimize gas waste. The reactor 100 may further include a lift 27 for raising and lowering the chuck 40 that supports a substrate in the process chamber 25.

The process chamber 25 further includes a body having a lower liner 22, an upper liner 23, and a door 24. The valve 35 may be disposed between the pump 30 and the process chamber 25 and may be operable to control pressure within the process chamber 25. The ceramic electrostatic chuck 40 may be disposed within the process chamber 25. The lid 50 may be disposed on the process chamber 25. The gas nozzle 55 may comprise a tunable gas nozzle having one or more outlets to selectively direct gas flow from the gas delivery system 102 to the process chamber 25. The gas nozzle 55 may be operable to direct gas flow into different areas within the process chamber 25, such as the center area and/or the side areas of the process chamber 25.

The source power 15 for generating and maintaining the plasma processes is coupled to the process chamber 25 via a power generating apparatus enclosed in a housing 11 disposed above the process chamber 25. The power generating apparatus may be in the form of one or more antennas or coils. The source power 15 may be operable to generate a radio frequency within a range from about 12 MHz to about 13.5 MHz, having pulsing capabilities, a power within a range from about 10 watts to about 5000 watts, and may further include a dynamic matching network 17. The source power 15 may comprise a dual tunable source so that the radio frequency may be changed during an etching cycle. The source power 15 may comprise a remote plasma source capable of generating high levels of plasma disassociation that is mountable to the reactor 100. If desired, the reactor 100 may include both an in-situ source power and a remote plasma source power, wherein the plasma is generated in a remote plasma chamber using the remote plasma source power and transferred to the process chamber 25, wherein the in-situ source power 15 maintains the generated plasma within the process chamber 25. In one embodiment, an etching cycle may be performed wherein the power range, i.e. the wattage of the source power 15, may be increased or decreased during the etching cycle. The source power 15 may be pulsed during the etching cycle.

The bias power 20 for biasing the substrate is coupled to the process chamber 25 and the chuck 40. The bias power 20 may be operable to generate a radio frequency of about 2 MHz having pulsing capabilities, a low power range from about 10 watts to about 500 watts, and may further include a dynamic matching network 21. The bias power 20 may be capable of generating a selectable radio frequency range from about 400 kHz to about 2 MHz, from about 100 kHz to about 2 MHz, and from about 100 kHz to about 13.56 MHz, having pulsing capabilities, a low power range from about 10 watts to about 500 watts, and may further include a dynamic matching network or a fixed matching network and a frequency tuner. An etching cycle may include a deposition step, a first etch step, and a second etch step, wherein the bias power 20 is used during the first etch step and the bias power 20 is decreased or increased during the second etch step. For example, the radio frequency of the bias power may be decreased or increased from the first etch step to the second etch step.

Figure 2:
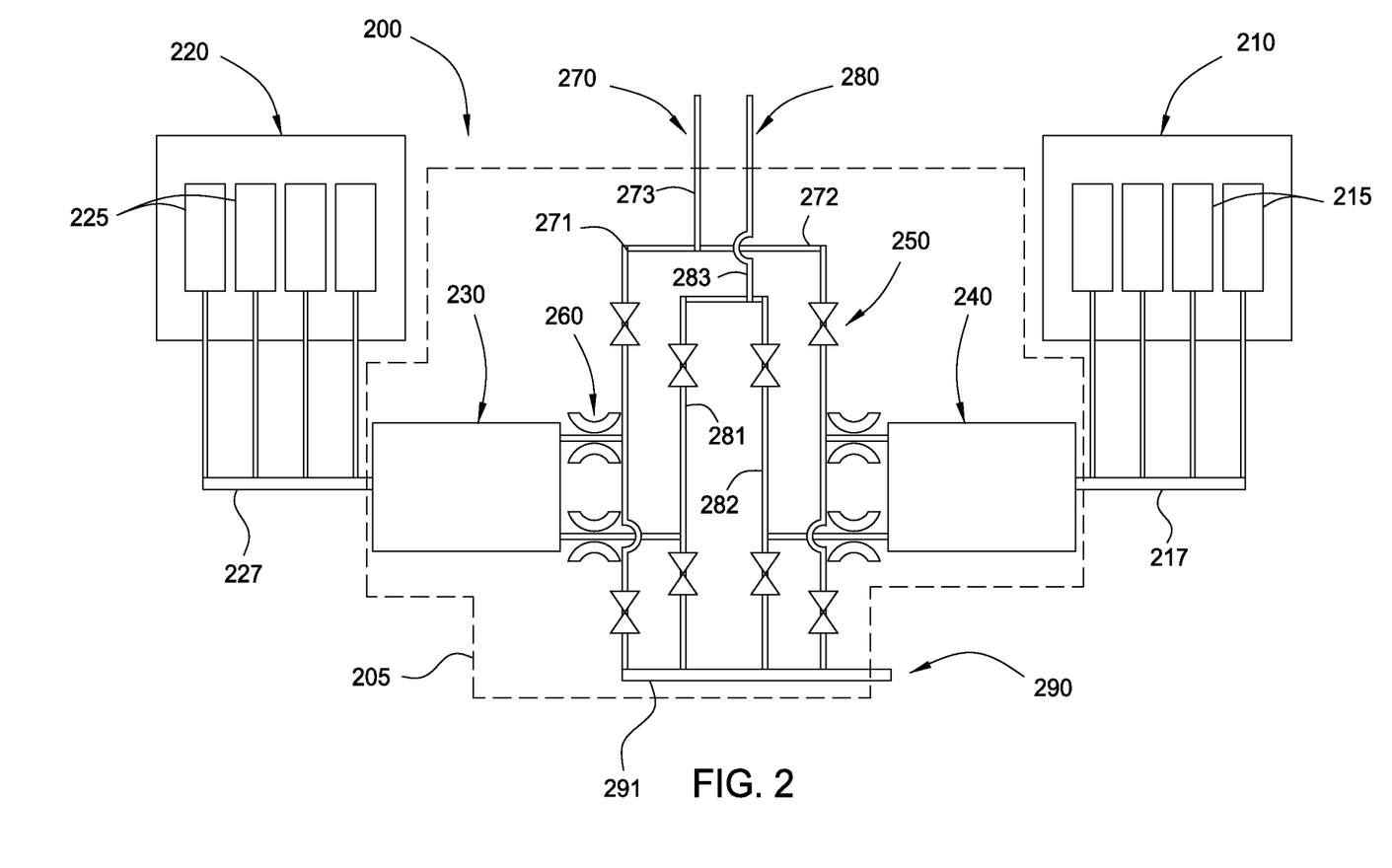
FIG. 2 illustrates an exemplary fast gas exchange module according to one embodiment of the invention.

FIG. 2 depicts a schematic diagram of one embodiment of the gas delivery system 102 (FIG. 1) having a fast gas exchange module 200 according to one embodiment of the invention. The fast gas exchange module 200 includes a housing 205 that contains a first flow controller 240, a second flow controller 230, numerous optional flow restrictors 260 and valves 250 to selectively direct gases into the process chamber 25 (shown in FIG. 1) via outlets 270 and 280, and an exhaust 290 for dumping the gas into the chamber exhaust downstream of the pump 30. Specifically, four flow restrictors 260 and eight valves 250 are shown in FIG. 2, but the number of flow restrictors 260 and valves 250 may vary if used. The first flow controller 240 is in communication with the outlet 270 via flow line 272 and outlet flow line 273. The second flow controller 230 is in communication with the outlet 270 via flow line 271, which is also in communication with outlet flow line 273. Each of the first and second flow controllers 240, 230 are in communication with the exhaust 290 via flow lines 272 and 271, respectively, and exhaust flow line 291. The first flow controller 240 is also separately in communication with the outlet 280 via flow line 282, which is in communication with outlet flow line 283. The second flow controller 230 is also separately in communication with the outlet 280 via flow line 281, which is also in communication with outlet flow line 283. Each of the first and second flow controllers are in communication with the exhaust 290 via flow lines 282 and 281, respectively, which are each individually coupled to exhaust flow line 291.

One or more of the flow paths from the first and second flow controllers to the exhaust 290, via flow lines 271, 272, 281, 282, and 291, may each define a pre-flow gas path as further described below. The one or more optional flow restrictors 260 and valves 250 may be located between the first and second flow controllers 240, 230 and the outlets 270, 280 and the exhaust 290 to control the routing of process gases to the outlets 270, 280 and the exhaust 290.

The outlets 270, 280 may be in communication with the one or more outlets of the gas nozzle 55 (described above) to selectively control the distribution of gases into the process chamber 25. The fast gas exchange module 200 and in particular the first and second flow controllers 240 and 230 are coupled to a first gas panel 210 and a second gas panel 220, respectively, for supplying process gases to the process chamber 25 using the fast gas exchange module 200. The first and second gas panels 210, 220 may be coupled to the fast gas exchange module 200 via a first flow line 217 and a second flow line 227. The first and second gas panels 210, 220 may include one or more gas sources 215, 225 and are operable to supply one or more gases through the first and second flow lines 217, 227 to the fast gas exchange module 200 and thus the process chamber 25. When configured for silicon etching, the fast gas exchange module 200 may supply a first gas, such as sulfur hexafluoride ($SF_6$), to the process chamber 25 during the first etch step and the second etch step from the first gas panel 210, and also supply a second gas, such as perfluorocyclobutane ($C_4F_8$), to the process chamber 25 during the deposition step from the second gas panel 220. In one example, the first gas panel 210 and the second gas panel 220 are operable to deliver $SF_6$ and $C_4F_8$ at about 1000 sccm. The first gas panel 210 and the second gas panel 220 may additionally deliver helium at about 500 sccm, and oxygen ($O_2$) and argon at about 200 sccm. If desired, a third gas panel (not shown) having a plasma sustaining gas, such as argon, may be coupled to the fast gas exchange module 200 and operable to continuously supply the gas to the process chamber 25 during the etching and deposition steps of the etching cycle.

In operation, as the gas from the first gas panel 210 is supplied to the process chamber 25, the first flow controller 240 may direct the gas to the outlet 280 via flow line 282, the outlet 270 via flow line 272, or both outlets. The optional flow restrictors 260 may be utilized to control the flow of gases within the fast gas exchange module 200. As the gas is being supplied to the process chamber 25, the valves 250 may be operable to selectively open the flow paths to the process chamber 25 and selectively close the flow paths to the exhaust flow line 291 and thus the exhaust 290. When the etching cycles switch between etch and deposition steps, the gas from the second gas panel 220 may be supplied to the process chamber 25 in a similar manner as the first gas panel 210. When the gas from the second gas panel 220 is being supplied to the process chamber 25, the valves 250 may be operable to close the flow paths from the first gas panel 210 to the process chamber 25 and selectively open the flow paths to the exhaust flow line 291 and thus the exhaust 290 to dump the gas in the flow lines. In one example, gas may be supplied from the first gas panel 210 to the process chamber 25 during the deposition steps, and gas may be supplied from the second gas panel 220 to the process chamber 25 during the etching steps. While the first and second gas panels 210, 220 are described to be set up for deposition or etching purpose, it is contemplated that both gas panels 210 and 220 may be used for both deposition and etching steps.

Figure 3:
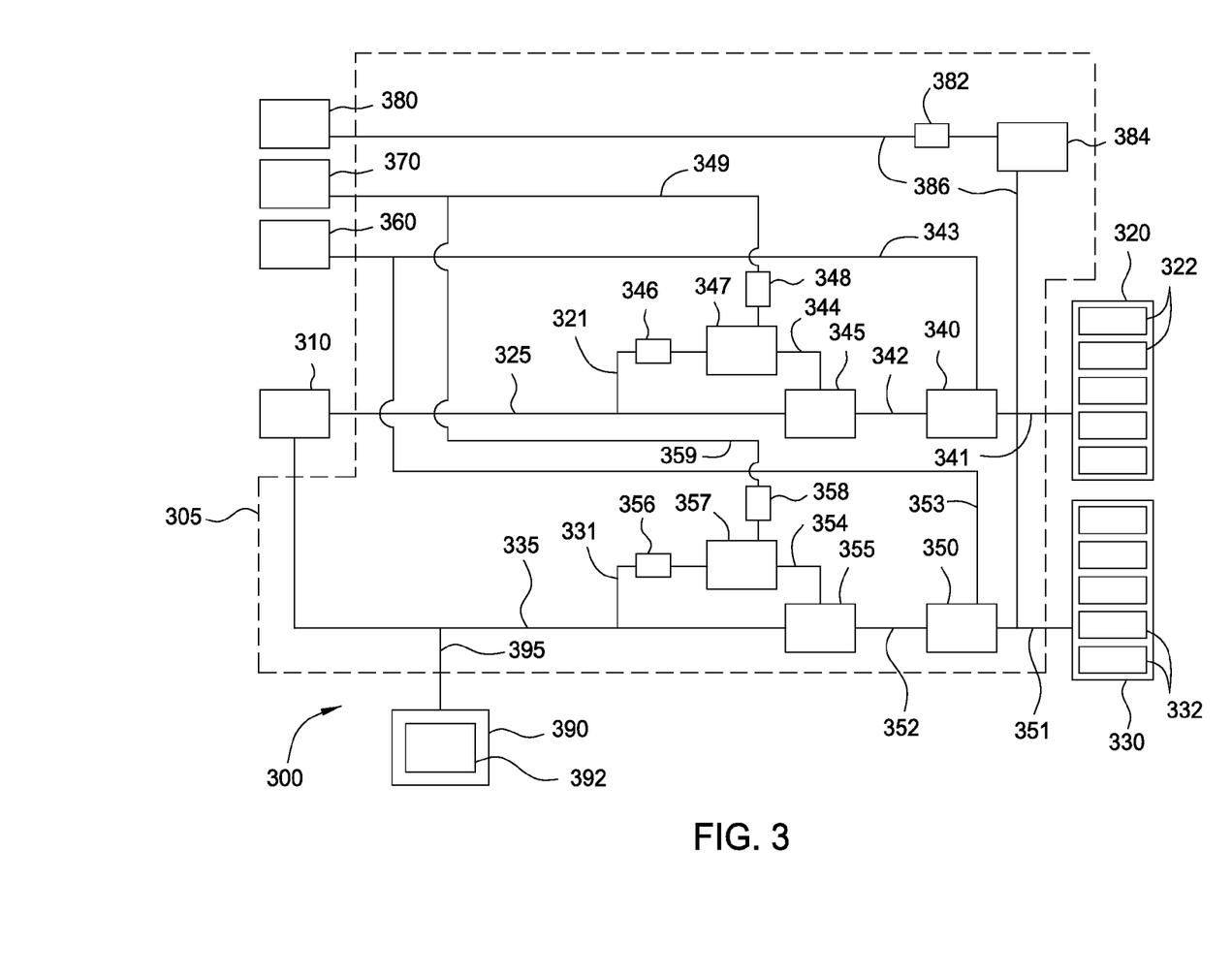
FIG. 3 illustrates an exemplary fast gas exchange module according to another embodiment of the invention.

FIG. 3 illustrates an alternative embodiment of an exemplary gas delivery system 300 that may be used in place of the gas delivery system 102 of FIG. 1. The fast gas exchange module 300 generally includes a housing 305 that contains a first flow controller 340, a second flow controller 345, and a third flow controller 347 that are in communication with each other to selectively divert gases into a process chamber 310 (such as process chamber 25 of the reactor 100 shown in FIG. 1), a first exhaust 360, and/or a second exhaust 370. The fast gas exchange module 300 and in particular the first flow controller 340 may be coupled to a first gas panel 320 via flow line 341. The first gas panel 320 may include a plurality of gas sources 322 suitable for etching silicon. For example, the first gas panel 320 may include various gas sources such as sulfur hexafluoride, oxygen, argon, trifluoromethane ($CHF_3$), and/or helium. Although the first gas panel 320 may be configured to interface with any number of gas sources, five gas sources are shown in the embodiment depicted in FIG. 3.

Each of the flow controllers 340, 345, and 347 may include flow control valves operable to selectively divert the gases to the exhausts 360, 370 and/or the process chamber 310. The flow control valves may include pneumatic actuators for pneumatic operation to allow rapid response and provide numerous flow options. In one example, the flow controllers 340, 345, and 347 include three-way valve which may be controlled to selectively divert a process gas from the gas sources 322 to a desired destination. For example, the first flow controller 340 may be configured to direct gas to the second flow controller 345 via flow line 342 and/or to the first exhaust 360 via flow line 343. The flow line 343 and the first exhaust 360 define a fast evacuation path that facilitates efficient removal of the gases from the second flow controller 345 to the first exhaust 360. The second flow controller 345 may be configured to direct gas to the process chamber 310 via flow line 325 and/or to the third flow controller 347 via flow line 344. Similarly, the third flow controller 347 may be operated to direct gas to the process chamber 310 through an optional flow restrictor 346 via flow line 321, to the second exhaust 370 through an optional flow restrictor 348 via flow line 349, which may be in communication with flow line 325, or to the second flow controller 345. While not shown here, it is contemplated that the flow controllers 340, 345, and 347 may be in communication with an operating system to control and monitor the operation of the valves.

The fast gas exchange module 300 may also include a first flow controller 350, a second flow controller 355, and a third flow controller 357 disposed within the housing 305 and in communication with each other to selectively divert gases into the process chamber 310, the first exhaust 360, and/or the second exhaust 370. The fast gas exchange module 300 and in particular the first flow controller 350 may be coupled to a second gas panel 330 via flow line 351. The second gas panel 330 may include a plurality of gas sources 332 suitable for etching silicon. For example, the second gas panel 330 may include various gas sources such as perfluorocyclobutane, oxygen, argon, trifluoromethane, and/or helium. Each of the flow controllers 350, 355, 357 may include flow control valves operable to divert the gases to the exhausts 360, 370 and/or the process chamber 310. In one example, the flow controllers 350, 355, 357 are three-way valve which may be controlled to selectively divert a process gas from the gas sources 332 to a desired destination. The flow control valves may include pneumatic operation to allow rapid response and provide numerous flow options in a fashion similar to flow controllers 340, 345, 347. For example, the first flow controller 350 may be configured to direct gas to the second flow controller 355 via flow line 352 and/or to the first exhaust 360 via flow line 353, thereby defining a fast evacuation path. The second flow controller 355 may be configured to direct gas to the process chamber 310 via flow line 335 and/or the third flow controller 357 via flow line 354. The third flow controller 357 may be operated to direct gas to the second exhaust 370 through the optional flow restrictor 358 via flow line 359 and/or to the process chamber 310 through the optional flow restrictor 356 via flow line 331, which may be in communication with flow line 335. Similarly, the flow controllers 350, 355, 357 may be in communication with an operating system to control and monitor the operation of the valves.

In operation, parallel flow lines 325 and 335 are configured to deliver gases independently to the process chamber 310 through a series of flow controllers and optional restrictions, such as flow controllers 340, 345, 347, 350, 355, 357, and optional flow restrictors 346, 356 to allow rapid gas switching. The flow lines 325, 335 are also operable to rapidly deliver gases independent and/or directly into the process chamber 310 to eliminate any gas delay observed through the optional flow restrictors 346 and 356. If desired, the flow lines 325, 335 may tie-in to each other prior to entering the process chamber 310. A multitude of gas deliveries and configurations may be provided with the fast gas exchange module 300. In one embodiment, a first gas (or combination of gases) may be delivered straight into the process chamber 310, such as through flow lines 341, 342, 325, and a second gas (or combination of gases) may be pulsed through the flow restrictor 356 of flow line 331 via flow lines 354, 352, 351 to allow controlled delivery options to the process chamber 310. Each of the valves in the fast gas exchange module 300 may include check valves to prevent back diffusion of the gases delivered through the flow lines. The first flow controllers 340, 350 are operable to direct gases through flow lines 343, 353, which are in communication with the first exhaust 360. The flow controllers 347, 357 are operable to direct gases through flow lines 349, 359, which are in communication with the second exhaust 370.

The fast gas exchange module 300 may include an optional flow line 386 that is in communication with either or both of flow lines 341, 351. The flow line 386 may include an optional flow controller 384 and/or an optional flow restrictor 382. The flow line 386 may be operable to direct gases to an exhaust 380 to dump the gases from all of the flow lines, thereby defining a fast evacuation path when needed. The exhausts 360, 370, 380 may comprise vacuum environments into which the gases are directed.

In one embodiment, the fast gas exchange module 300 may be coupled to an optional gas panel 390 to provide a gas source 392, such as a purge gas, to the process chamber 310 via a flow line 395 that is in communication with the flow line 335 in combination with the embodiments described herein. The gas panel 390 may provide a rapid direct line to the process chamber 310 to provide a gas for processing with the gases from either or both of the first and second gas panels during an etching cycle. The flow line 395 may include a flow controller and/or restrictor (not shown) to control flow of the gas 390 to the process chamber 310. The gas source 392 may be operable to purge any residual gas mixtures remaining in the process chamber 310, as well as the flow lines. In one embodiment, one or more of the flow controllers may be actuated into open positions to purge the residual gas mixtures to one or more of the exhausts 360, 370, 380 through either or both flow lines 325, 335 using the gas source 392 supplied from the gas panel 390. While not shown, it is contemplated that a similar gas panel arrangement may be provided in communication with the flow line 325.

In one embodiment, a substrate may be located in the process chamber 310 for forming a profile in the substrate during a process. The process may include one or more steps, such as etching steps and deposition steps, which may be alternately and/or continuously repeated in a desired order to form the profile. A first gas mixture including one or more gases provided from the gas sources 322 of the first gas panel 320 may be supplied from the first gas panel 320 to the process chamber 310 through the first and second flow controllers 340, 345 via flow lines 341, 342, 325 and/or through the first, second, and third flow controllers 340, 345, 347 via flow lines 341, 342, 344, 321, 325 during one or more of the process steps. A second gas mixture including one or more gases provided from the gas sources 332 of the second gas panel 330 may be supplied from the second gas panel 330 to the process chamber 310 through the first and second flow controllers 350 and 355 via flow lines 351, 352, 335 and/or through the first, second, and third flow controllers 350, 355, 357 via flow lines 351, 352, 354, 321, 335 during one or more of the process steps. The first and second gas mixtures may be rapidly switched and supplied to the process chamber 310 when switching process steps. The first and second gas mixtures may also be diverted from the respective flow lines 325 and 335 to the exhausts 360, 370, 380 when switching process steps and while the other gas mixture is being supplied to the process chamber 310. In addition, the composition of the gas mixtures may be changed during the switching process steps to provide a different gas mixture to the chamber during a process step. If desired, the first and second gas mixtures may also be supplied to the process chamber 310 simultaneously during a process step. The flow controllers may provide unrestricted flow paths to the process chamber 310.

In one embodiment, the fast gas exchange systems are operable to provide continuous rapid switching of gas mixtures in a chamber while processing a substrate in the chamber when switching from a first etch step to a second etch step and/or to a deposition step using one or more valves, such as a combination of flow controllers, such as three-way valves, which may include pneumatic actuators to provide rapid response actuation. For example, during a deposition step, a first gas mixture may be supplied to the chamber, while a second gas mixture may be routed to the chamber in preparation for introduction into the chamber during an etch step that will follow the deposition step. Each step may last less that about 1 second in duration. For example, the deposition step may last about 0.5 seconds and the etch step may last about 0.75 seconds, and the steps may continuously and alternately be repeated to process a substrate in the chamber as the respective gas mixtures are supplied during the representative step. One or more sensors (not shown) may be attached to the valves to monitor the performance of the gas mixtures supplied to the chamber.

Figure 4:
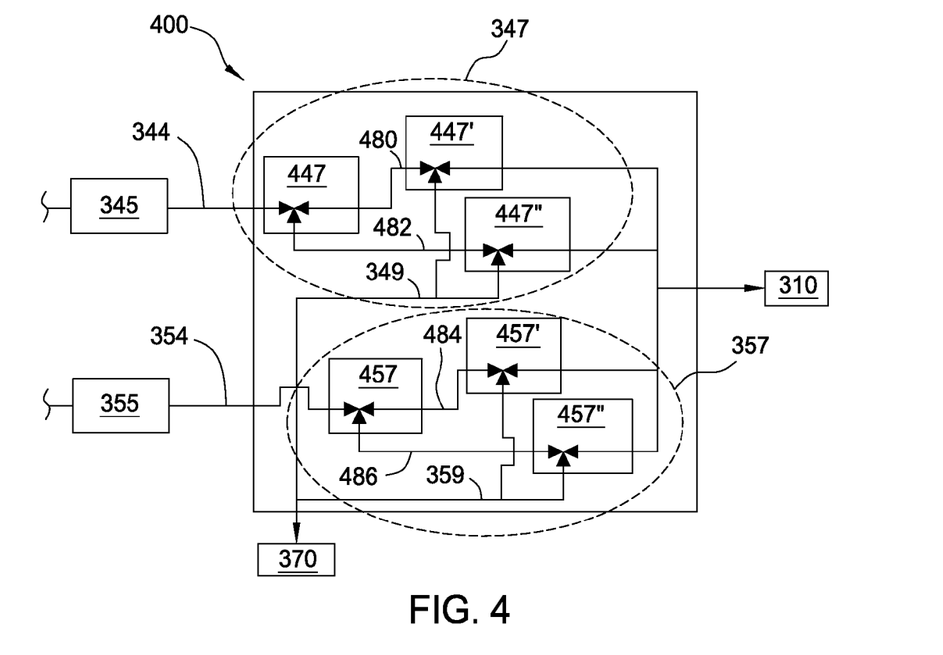
FIG. 4 illustrates an alternative fast gas exchange module of FIG. 3 having multiple flow controllers.

FIG. 4 illustrates an alternative configuration 400 of a third flow controller 347 and 357 (FIG. 3) having multiple flow controllers. It should be noted that some elements such as flow restrictors 346, 356, 348, and 358 shown in FIG. 3 have been omitted from FIG. 4 for the sake of clarity. In this embodiment the components and possible variations thereof are identical to those of the fast gas exchange module 300 except for the third flow controller 347 and 357 being replaced by multiple flow controllers 447, 447', 447" and flow controllers 457, 457', 457", respectively. As will be discussed below, with a pre-determined timed sequence of flow controller actuation (i.e., valve timing control), such configuration 400 using multiple flow controllers is believed to add flexibility in switching speed and pressure control so that resultant gas flow into the process chamber 310 switches faster in the process chamber while having individual flow controller continued to operate at a lower switching speed and therefore longer service life.

In various embodiments, the flow controllers 447 and 447' or 447 and 447" are in fluid communication with each other to selectively divert gas(es) into the process chamber 310 (such as process chamber 25 of the reactor 100 shown in FIG. 1) or the second exhaust 370. The flow controller 447 is in fluid communication with a first gas panel 320 through the first and second flow controllers 340, 345 via flow line 341 (FIG. 3), as discussed previously. The flow controllers 447, 447', or 447" may be a three-way valve, T-valve or the like so that each of the flow controllers 447, 447' and 447" is independently operated to selectively open to divert gas(es) to the process chamber 310 or the exhaust (e.g., the second exhaust 370) through flow restrictors (not shown). For example, the flow controller 447 may be operated to direct gas(es) flowing from the second flow controller 345 to the flow controller 447' via flow line 480 and/or to the flow controller 447" via flow line 482. The flow controller 447' may be operated to direct gas(es) flowing from the flow controller 447 to the process chamber 310 through an optional flow restrictor 346 (FIG. 3) via flow line 321, which may be in communication with flow line 325 and/or to the second exhaust 370 through an optional flow restrictor 348 (FIG. 3) via flow line 349. Similarly, the flow controller 447" may be operated to direct gas(es) flowing from the flow controller 447 to the process chamber 310 through the optional flow restrictor 346 (FIG. 3) via flow line 321 and/or to the second exhaust 370 through the optional flow restrictor 348 (FIG. 3) via flow line 349. It is contemplated that a different number of flow controllers and arrangement may be used and should not be limited to those shown in FIG. 4.

The flow controllers may be selectively closed to provide various flowing benefits. Taking flow controllers 447, 447', and 447" as an example, when switching from one chemistry mixture and flow rate to another, any of the flow controllers, for example flow controller 447, may be closed such that gas(es) downstream of the flow controller 447 will continue to flow into the process chamber 310 or the exhaust (e.g., the second exhaust 370) and gas(es) upstream of the flow controller 447 will not. Gas(es) from upstream of the closed flow controller, for example flow controller 447, will not reach the process chamber 310 while it is closed. In this manner, the process chamber 310 will run uninterrupted from the gas(es) downstream of the flow controller 447 while the gas(es) upstream of the flow controller 447 are switched to the next desired chemical mixture and flow rate. In another example, any of the flow controllers, for example flow controller 447', may be closed such that gas(es) may be supplied to upstream of the flow controller 447' in a condition that substantially matches the condition of the gas(es) as if it were flowing into the process chamber 310. This allows the gas(es) upstream of the flow controller 447' to rapidly reach a steady state condition that is substantially maintained, defining a "pre-flow" path which allows the gas(es) upstream of the flow controller 447' to stabilize in a "process condition" before being delivered into the process chamber 310 without experiencing any pressure drop and diminished flow rates. Thus, the uniformity of gas delivery is quickly established because the pre-flow path provides substantially the same resistance and flow conditions as if the gases were flowing into the process chamber. Alternatively, the flow controllers 447' and 447" may be alternately closed so that a purge gas may flow through one flow controller, e.g., flow controller 447', to the exhaust while the other flow controller is being used for delivering process gas(es). While the description herein is directed to flow controllers 447, 447' or 447", it is contemplated that similar approach is also applicable to flow controllers 457, 457', and 457". Various flowing configurations and advantages thereof is described in U.S. patent application Ser. No. 12/407,548, filed May 19, 2009, entitled "METHOD AND APPARATUS OF A SUBSTRATE ETCHING SYSTEM AND PROCESS," which is incorporated by reference in its entirety.

Figure 5:
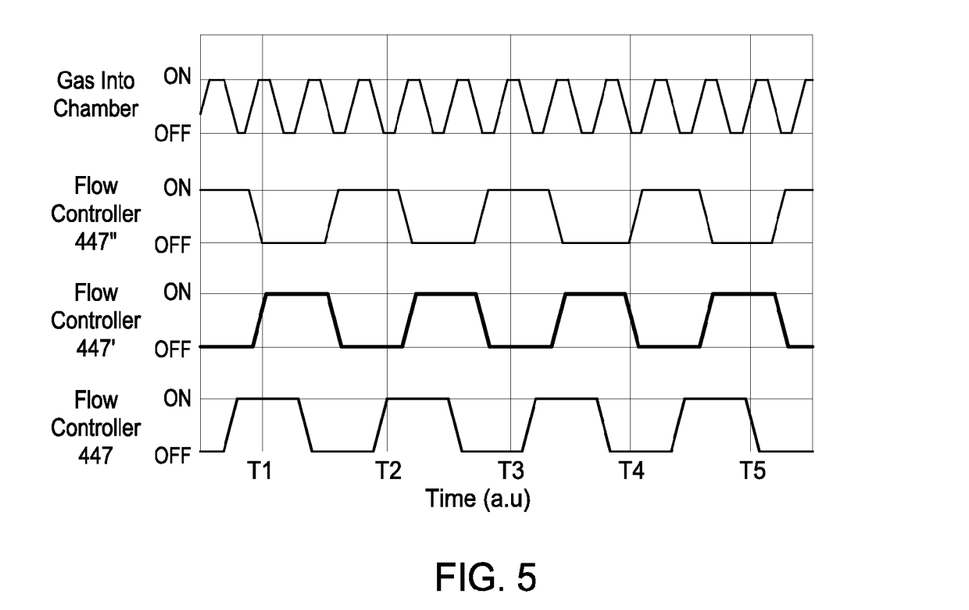
FIG. 5 is a graph illustrating an on/off state of flow controllers plotted as a function of time for an exemplary embodiment of the invention.

The following Table 1 illustrates several instances in one embodiment where output (i.e., gas mixture flows into the chamber) varies upon different valve timing control (On/Off) of the flow controllers 447, 447', 447" and 457, 457', 457" at different time with a fixed time interval. For better understanding of the relationship between the valve timing control and gas output, Table 1 will be discussed in reference to FIGS. 4 and 5. FIG. 5 illustrates an exemplary embodiment where gas output in the process chamber is kept relatively constant as a function of time while each of the flow controllers is in a pre-determined timed sequence (i.e., either on or off at any given time) based on Table 1. It is contemplated that the frequency of the diverting state changed on each of the flow controllers may vary depending upon the application or desired trench profile.

whereas the flow controller 457'="0" represents that the flow controller 457' is open only to the exhaust (e.g., the second exhaust 370) via flow line 359. The flow controller 457"="1" represents that the flow controller 457" is open only to the process chamber 310 via flow line 335, whereas the flow controller 457"="0" represents that the flow controller 457" is open only to the exhaust (e.g., the second exhaust 370) via flow line 359. The Output2="True" represents that gas(es) is being delivered to the process chamber 310, whereas Output2="False" represents that gas(es) is blocked from entering the process chamber 310. Accordingly, the gas output calculation based on the state of flow controllers 457, 457', 457" may be represented by the formula: Output2= [Flow controller 457 AND Flow controller 457'] OR [NOT (Flow controller 457) AND Flow controller 457"].

In an exemplary embodiment, with flow controllers 447 and 447' being "1" state and flow controller 447" being "0" state at time (T) T1, the gas mixture flowing from the second flow controller 345 will be directed to a process chamber 310 (such as process chamber 25 of the reactor 100 shown in FIG. 1) through the flow controller 447 and 447' sequentially, resulting in a "True" (i.e., On) operational state of gas flow

TABLE 1

| T | 447 | 447' | 447" | Output1 | 457 | 457' | 457" | Output2 | GasMix1 | GasMix2 |
|---|-----|------|------|---------|-----|------|------|---------|---------|---------|
| 1 | 1 | 1 | 0 | TRUE | 0 | 1 | 0 | FALSE | 1 | 0 |
| 2 | 1 | 0 | 1 | FALSE | 0 | 0 | 1 | TRUE | 0 | 1 |
| 3 | 0 | 0 | 1 | TRUE | 1 | 0 | 1 | FALSE | 1 | 0 |
| 4 | 0 | 1 | 0 | FALSE | 1 | 1 | 0 | TRUE | 0 | 1 |
| 5 | 1 | 1 | 0 | TRUE | 0 | 1 | 0 | FALSE | 1 | 0 |
| 6 | 1 | 0 | 1 | FALSE | 0 | 0 | 1 | TRUE | 0 | 1 |
| 7 | 0 | 0 | 1 | TRUE | 1 | 0 | 1 | FALSE | 1 | 0 |
| 8 | 0 | 1 | 0 | FALSE | 1 | 1 | 0 | TRUE | 0 | 1 |
| 9 | 1 | 1 | 0 | TRUE | 0 | 1 | 0 | FALSE | 1 | 0 |
| 10 | 1 | 0 | 1 | FALSE | 0 | 0 | 1 | TRUE | 0 | 1 |
| 11 | 0 | 0 | 1 | TRUE | 1 | 0 | 1 | FALSE | 1 | 0 |
| 12 | 0 | 1 | 0 | FALSE | 1 | 1 | 0 | TRUE | 0 | 1 |

In Table 1, the flow controller 447=1 represents that the flow controller 447 is open only to the flow controller 447' via flow line 480, whereas the flow controller 447="0" represents that the flow controller 447 is open only to the flow controller 447" via flow line 482. The flow controller 447'="1" represents that the flow controller 447' is open only to the process chamber 310 via flow line 325 (FIG. 3), whereas the flow controller 447'="0" represents that the flow controller 447' is open only to the exhaust (e.g., the second exhaust 370) via flow line 349. The flow controller 447"="1" represents that the flow controller 447" is open only to the process chamber 310 via flow line 325, whereas the flow controller 447"="0" represents that the flow controller 447" is open only to the exhaust (e.g., the second exhaust 370) via flow line 349. The Output1="True" represents that gas(es) is being delivered to the process chamber 310, whereas Output1="False" represents that gas(es) is blocked from entering the process chamber 310. Accordingly, the gas output calculation based on the state of flow controllers 447, 447', 447" may be represented by the formula: Output1=[Flow controller 447 AND Flow controller 447'] OR [NOT (Flow controller 447) AND Flow controller 447"].

Similarly, in Table 1 the flow controller 457=1 represents that the flow controller 457 is open only to the flow controller 457' via flow line 484, whereas the flow controller 457="0" represents that the flow controller 457 is open only to the flow controller 457" via flow line 486. The flow controller 457'="1" represents that the flow controller 457' is open only to the process chamber 310 via flow line 335 (FIG. 3), into the process chamber 310, as shown in FIG. 5. As the flow controller 447" is in a state only open to the exhaust, the gas mixture flowing from the process chamber 310 will be blocked from flowing to the flow controller 447".

At time T2, with flow controller 447 and 447" being "1" state and flow controller 447' being "0" state, the gas mixture flowing from the second flow controller 345 or any residual gas(es) in the process chamber delivery path will be directed to the exhaust (e.g., the second exhaust 370) through the flow controllers 447 and 447' sequentially, resulting in a "False" (i.e., Off) operational state of gas flow into the process chamber, as shown in FIG. 5. As the flow controller 447' is in a state only open to the exhaust and the flow controller 447" is in a state only open to the process chamber 310, the gas mixture or residual gas(es) will not flow to the flow controller 447" and any gas(es) flowing from the process chamber 310 will be blocked from entering the exhaust or the flow controller 447'. In certain applications, this timed sequence of flow controller actuations may be advantageous since the process chamber 310 can run uninterrupted from the gas(es) downstream of the flow controller 447' while the gas(es) upstream of the flow controller 447' are directed to exhaust. If desired, a purge gas may flow through the flow controller 447 and 447' to pre-clean the process chamber delivery path while running gas(es) downstream of the flow controller 447' or 447" into the process chamber 310. Alternatively, a new chemical mixture may be pre-loaded the process chamber delivery path (e.g., at least the section upstream of the flow controller 447') to stabilize flow of the new chemical mixture and flow rate, such that the new chemical mixture and flow rate can be timed to be delivered to the process chamber 310 faster or as close as possible to the requested time.

At time T3, with flow controller 447 and 447' being "0" state and flow controller 447" being "1" state, the gas mixture flowing from the second flow controller 345 is directed to the process chamber 310 through the flow controllers 447 and 447" sequentially, resulting in a "True" operational state of gas flow into the process chamber 310, as shown in FIG. 5. As the flow controller 447' is in a state only open to the exhaust, the gas mixture will be blocked from flowing to the flow controller 447'.

At time T4, with flow controller 447 and 447" being "0" state and flow controller 447' being "1" state, the gas mixture flowing from the second flow controller 345 or any residual gas(es) in the process chamber delivery path will be directed to the exhaust (e.g., the second exhaust 370) through the flow controllers 447 and 447" sequentially, resulting in a "False" operational state of gas flow into the process chamber, as shown in FIG. 5. As the flow controller 447' is in a state only open to the process chamber 310 and the flow controller 447" is in the state only open to the exhaust, the gas mixture from the process chamber 310 will be blocked from entering the exhaust or flowing back to the flow controller 447.

At time T5, flow controllers 447, 447', and 447" may be controlled to repeat the operating state identical to those of time T1. While not shown in FIG. 5, it is understood from Table 1 that after time T4, the flow controllers 447, 447', and 447" may be controlled to continuously repeat the operating state identical to those of time T1, T2, T3, and T4 to obtain similar timed sequence of flow controller actuations. It is understood that the operating states associated with the flow controllers 457, 457', 457" are controlled in a fashion similar to flow controllers 447, 447', and 447" as discussed above with respect to Table 1, except that the gas output (Output2) is in an operational state opposite to that of the gas output (Output1) for flow controllers 447, 447', and 447" due to switching of the gas during the process. The details of the operating state for the flow controllers 457, 457', and 457" and corresponding gas output (Output2) will not be redundantly discussed here.

When switching from a first etch step to a second etch step and/or to a deposition step, parallel flow lines 325 and 335 (FIG. 3) are configured to receive gas(es) flowing from any of the flow controllers 447', 447" and the flow controllers 457', 457", respectively, in a manner as discussed above and deliver gas(es) independently to the process chamber 310 to allow rapid gas switching. If desired, the flow lines 325 and 335 may be tie-in to each other prior to entering the process chamber 310. As can be seen in FIG. 5, the flow controllers 447, 447', and 447" are operated for synchronized switching of gas(es) in a pre-determined timed sequence of flow controller actuation illustrated in Table 1 such that the frequency of gas output (i.e., a gas mixture to the process chamber) is twice the frequency of the operating state changed on each of the flow controllers. For example, in any given time period such as from time T1 to T3, or from T3 to T5, each of the flow controllers 447, 447', and 447" change its operating state only twice whereas the resulting gas output switches four times during the same period of time, as also evident from the operating state shown in Table 1. In certain applications, this embodiment is advantageous in comparison to the fast gas exchange module 300 where the flow controller 347 or 357 has the same switching frequency as the gas mixture flowing into the process chamber because the proposed configuration using multiple flow controllers with a pre-determined timed sequence of flow controller actuation shifts the limit in speed and lifetime service on individual flow controller, results in faster switching speed of gas in the process chamber while having individual flow controller continued to operate at a lower switching speed and thus longer service life.

While not shown in FIG. 4, it is contemplated that the formula or the flow controllers may be calculated and controlled by a controller having a central processing unit (CPU) or logic device, a memory, and a supporting circuit. The controller may be of any form of a general purpose computer processor that can be used in an industrial setting for synchronizing the opening and closing of each flow controller. The software routines associated with these settings can be stored in the memory, such as random access memory, read only memory, floppy or hard disk drive, or other form of digital storage. The support circuit is conventionally coupled to the CPU and may comprise cache, clock circuits, input/output sub-systems, power supplies, and the like. The software routines may be executed by the chamber CPU or any stand-alone device that will accept a desired switching frequency as input and compute and output the synchronized on-off signals to individual flow controller in accordance with the present invention. In various embodiments, the software routines may be executed and cooperated as desired with one or more sensors or flow ratio controllers provided at various locations in the gas delivery system to adjust the gas outputs or other component of the fast gas exchange module 200, 300, or configuration 400 with multiple flow controllers such that a desired composition, flow ratio, pressure, rate and/or volume of gases are provided to the process chamber 310. The software routines may be executed to monitor the composition of gases within various portions of the gas delivery system so that the status of purging, chemical mixing, gas changes and the like may be controlled in real time, thereby enhancing system response time and minimizing waste of expensive process gases.

The fast gas exchange module 200, 300, or configuration 400 with multiple flow controllers shown in FIGS. 2, 3 and 4 is believed to provide various benefits such as reducing gas delay from a flow controller to the process chamber, reducing gas switching time, and reducing gas delivery lag between process steps. These benefits result in higher overall etch rates, reduced roughness of trench sidewalls, and increased ability to control trench profiles. The fast gas exchange module 200, 300, or configuration 400 with multiple flow controllers may be utilized with etching systems that employ multi-step processes, such as the TMGM system or the Bosch system. The same hardware and operating scheme can be also used in for example atomic layer deposition (ALD) processes that require gas switching at a high rate through the process chamber.

While the foregoing is directed to embodiments of the invention, other and further embodiments of the invention may be devised without departing from the basic scope thereof, and the scope thereof is determined by the claims that follow.

What is claimed is:

1. A method of supplying gases to a process chamber, comprising:
   supplying a first process gas to the process chamber from a first gas panel through a first fast gas exchange module during a first process, comprises selectively diverting the first process gas from a first flow controller through a second flow controller to the process chamber or an exhaust, or selectively diverting the first process gas from the first flow controller through a third flow controller to the process chamber or the exhaust, wherein the second flow controller is in fluid communication with the third flow controller;

supplying a second process gas to the process chamber from a second gas panel through a second fast gas exchange module during a second process, comprises selectively diverting the second process gas from a fourth flow controller through a fifth flow controller to the process chamber or an exhaust, or selectively diverting the second process gas from the fourth flow controller through a sixth flow controller to the process chamber or the exhaust, wherein the fifth flow controller is in fluid communication with the sixth flow controller, wherein the first and second process gases are supplied into the process chamber in an alternating sequence; and synchronizing a change in a diverting state of each of the flow controllers in the first and second fast gas exchange modules so that a frequency of the first or second process gas flowing into the process chamber is twice a frequency of the change in the diverting state for each of the flow controllers in the first or second fast gas exchange module.

2. A method of supplying gases to a process chamber, comprising:

supplying a first process gas to the process chamber from a first gas panel through a first fast gas exchange module during a first process, wherein the first fast gas exchange module comprising:
  a first flow controller coupling to the first gas panel;
  a second flow controller coupling to the first flow controller and the process chamber; and
  a third flow controller coupling to the second flow controller and the process chamber, wherein the first flow controller is operable to selectively divert the first process gas flowing from the first gas panel to the second flow controller or the third flow controller, the second flow controller is operable to selectively divert the first process gas flowing from the first flow controller to the processing chamber or a exhaust, and the third flow controller is operable to selectively divert the first process gas flowing from the second flow controller to the processing chamber or the exhaust; and supplying a second process gas to the processing chamber from a second gas panel through a second fast gas exchange module during a second process, wherein the second fast gas exchange module comprising:
  a fourth flow controller coupling to the second gas panel;
  a fifth flow controller coupling to the fourth flow controller and the process chamber; and
  a sixth flow controller coupling to the fifth flow controller and the process chamber, wherein the fourth flow controller is operable to selectively divert the second process gas flowing from the second gas panel to the fifth flow controller or the sixth flow controller, the fifth flow controller is operable to selectively divert the second process gas flowing from the fourth flow controller to the process chamber or the exhaust, and the sixth flow controller is operable to selectively divert the second process gas flowing from the fifth flow controller to the process chamber or the exhaust; and synchronizing a change in a diverting state of each of the flow controllers in the first and second fast gas exchange modules so that a frequency of the first or second process gas flowing into the process chamber is twice a frequency of the change in the diverting state for each of the flow controllers in the first or second fast gas exchange module.

3. The method of claim 2, wherein the second and third flow controllers are controlled to simultaneously operate in a diverting state opposite to each other.

4. The method of claim 3, wherein the first and second flow controllers simultaneously direct the first process gas from the first gas panel to the process chamber.

5. The method of claim 3, wherein the first flow controller and the second flow controller simultaneously direct the first process gas from the first gas panel to the exhaust.

6. The method of claim 3, wherein the first flow controller and the third flow controller simultaneously direct the first process gas from the first gas panel to the process chamber.

7. The method of claim 3, wherein the first flow controller and the third flow controller simultaneously direct the first process gas from the first gas panel to the exhaust.

8. The method of claim 2, wherein the fifth and sixth flow controllers are controlled to simultaneously operate in a diverting state opposite to each other.

9. The method of claim 8, wherein the fourth and fifth flow controllers simultaneously direct the second process gas from the second gas panel to the process chamber.

10. The method of claim 8, wherein the fourth flow controller and the fifth flow controller simultaneously direct the second process gas from the second gas panel to the exhaust.

11. The method of claim 8, wherein the fourth flow controller and the sixth flow controller simultaneously direct the second process gas from the second gas panel to the process chamber.

12. The method of claim 8, wherein the fourth flow controller and the sixth flow controller simultaneously direct the second process gas from the second gas panel to the exhaust.

13. The method of claim 2, wherein the first and second process gases are selected from a group consisting of etching gas, deposition gas, passivation gas, and cleaning gas.

14. The method of claim 2, wherein the first and second processes are performed in an alternating sequence.

15. A gas delivery system, comprising:
a process chamber for processing a substrate; and
a fast gas exchange module in fluid communication with a first gas panel and the process chamber, wherein the fast gas exchange module having a first flow controller configuration comprising:
  a first flow controller coupling to the first gas panel;
  a second flow controller coupling to the first flow controller and the process chamber; and
  a third flow controller coupling to the second flow controller and the process chamber, wherein the third flow controller comprises a first sub-flow controller, a second sub-flow controller, and a third sub-flow controller, the third sub-flow controller is not in fluid communication with the second sub-flow controller, and the first sub-flow controller and the second sub-flow controller or the first sub-flow controller and the third sub-flow controller are in fluid communication with each other and are operable to selectively divert a first gas flowing from the second flow controller to the process chamber or a exhaust; and
  wherein the second flow controller is in fluid communication with the third flow controller, wherein the first flow controller is operable to selectively divert the first gas flowing from the first gas panel to the second flow controller or the third flow controller, the second flow controller is operable to selectively divert the first gas flowing from the first flow controller to the third flow controller or to the process chamber.

16. The gas delivery system of claim 15, wherein the second and third flow controllers are simultaneously operated in a diverting state opposite to each other.

17. The gas delivery system of claim 15, further comprising:
 a second gas panel; and
 a second flow controller configuration in fluid communication with the second gas panel and the process chamber, comprising:
  a fourth flow controller coupled to the second gas panel;
  a fifth flow controller coupling the fourth flow controller and the process chamber; and
  a sixth flow controller coupling the fifth flow controller and the process chamber, wherein the sixth flow controller comprises a first sub-flow controller, a second sub-flow controller, and a third sub-flow controller, the third sub-flow controller is not in fluid communication with the second sub-flow controller, and the first sub-flow controller and the second sub-flow controller or the first sub-flow controller and the third sub-flow controller are in fluid communication with each other and are operable to selectively divert a second gas flowing from the fifth flow controller to the process chamber or the exhaust; and
 wherein the fifth flow controller is in fluid communication with the sixth flow controller, wherein the fourth flow controller is operable to selectively divert the second gas flowing from the second gas panel to the fifth flow controller or the sixth flow controller, the fifth flow controller is operable to selectively divert the second gas flowing from the fourth flow controller to the sixth flow controller or to the process chamber.

18. The gas delivery system of claim 17, wherein the fifth and sixth flow controllers are simultaneously operated in a diverting state opposite to each other.

19. The gas delivery system of claim 17, wherein the first, second, third, fourth, fifth, and sixth flow controllers comprise a three-way valve.

* * * * *